United States Patent
Ranade

(10) Patent No.: US 7,750,471 B2
(45) Date of Patent: Jul. 6, 2010

(54) METAL AND ALLOY SILICIDES ON A SINGLE SILICON WAFER

(75) Inventor: Pushkar Ranade, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 238 days.

(21) Appl. No.: 11/823,843

(22) Filed: Jun. 28, 2007

(65) Prior Publication Data

US 2009/0001588 A1    Jan. 1, 2009

(51) Int. Cl.
*H01L 23/48*    (2006.01)
*H01L 21/4763*    (2006.01)
*H01L 21/44*    (2006.01)

(52) U.S. Cl. .............. 257/754; 257/755; 257/757; 257/768; 257/E21.593; 257/E29.161; 438/649; 438/651; 438/682

(58) Field of Classification Search ............... 438/283, 438/649, 651, 682; 257/754, 755, 757, 768
See application file for complete search history.

(56) References Cited

U.S. PATENT DOCUMENTS

2005/0156208 A1 *  7/2005  Lin et al. ............... 257/288
2005/0285206 A1 * 12/2005  Kadoshima et al. ...... 257/369

* cited by examiner

*Primary Examiner*—Hsien-ming Lee
(74) *Attorney, Agent, or Firm*—Caven & Aghevli LLC

(57) ABSTRACT

Methods and apparatus relating to a single silicon wafer having metal and alloy silicides are described. In one embodiment, two different silicides may be provided on the same wafer. Other embodiments are also disclosed.

16 Claims, 4 Drawing Sheets

METAL AND ALLOY SILICIDES ON A SINGLE SILICON WAFER

BACKGROUND

The present disclosure generally relates to the field of electronics. More particularly, an embodiment of the invention relates to a single silicon wafer having metal and alloy silicides.

A silicide generally refers to a compound that includes silicon and some other element (such as an electropositive element). Silicides may be used to form portions of semiconductor devices on a silicon wafer.

In some current implementations, a single silicide material (such as a layer of NiSi or TiSi) may be used. Such approaches may, however, improve the performance of one type of device while reducing the performance of another type of device.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

As discussed above, some current techniques may improve the performance of one type of semiconductor device while reducing the performance of another type of semiconductor device. To improve performance in accordance with some embodiments discussed herein, metal silicides with different barrier heights may be provided for Negative Metal Oxide Semiconductor (NMOS) and Positive Metal Oxide Semiconductor (PMOS) devices. For example, some embodiments may use a first silicide which provides a relatively low barrier height (e.g., about 4 eV in an embodiment) for NMOS devices and a second silicide which provides a relatively high barrier height (e.g., about 5 eV) for PMOS devices formed on the same wafer. Accordingly, some of the embodiments discussed herein may enable dual silicide formation on a single semiconductor wafer.

In some embodiments, a silicide may be used to provide ohmic contacts of the source, drain, and poly-Si gate of a transistor, e.g., in a Complementary Metal-Oxide Semiconductor (CMOS) process. Moreover, some of the embodiments discussed herein may enable fabrication of CMOS devices with two different silicides (e.g., metal and alloy silicides) on a single silicon wafer. Such techniques may provide two different types of devices (e.g., NMOS and PMOS devices) on the same semiconductor wafer, for example, with improved performance for each type.

FIGS. 1A-1D illustrate various resulting semiconductor structures in accordance with some embodiments discussed herein. FIG. 2 illustrates a flow diagram of a method 200 to provide silicides on a single semiconductor wafer, in accordance with an embodiment. In accordance with one embodiment, the method 200 (and resulting structures of FIGS. 1A-1D) may be used where one metal silicide and one alloy silicide are to be formed on a single wafer. In an embodiment, alloy silicide may be formed by interdiffusion of first metal and a second metal silicide, such as discussed with reference to FIGS. 1A-2.

Figure 1A:
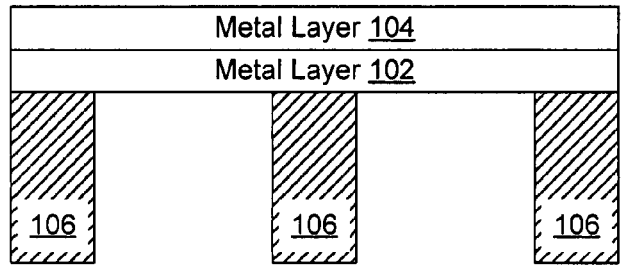
FIGS. 1 and 3 illustrate block diagrams of semiconductor structures, in accordance with some embodiments discussed herein.
Figure 1B:
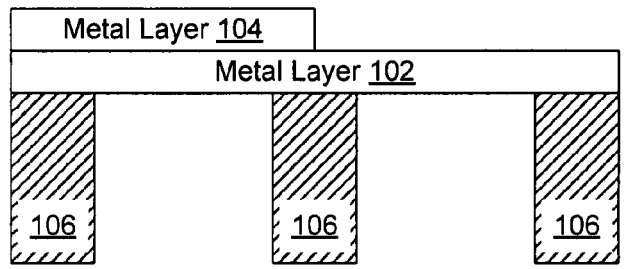
Figure 1C:
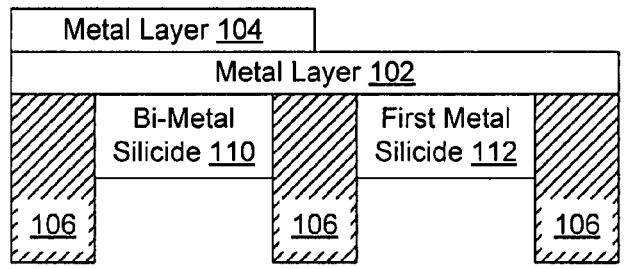
Figure 1D:
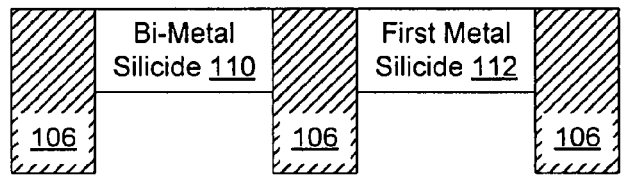
Figure 2:
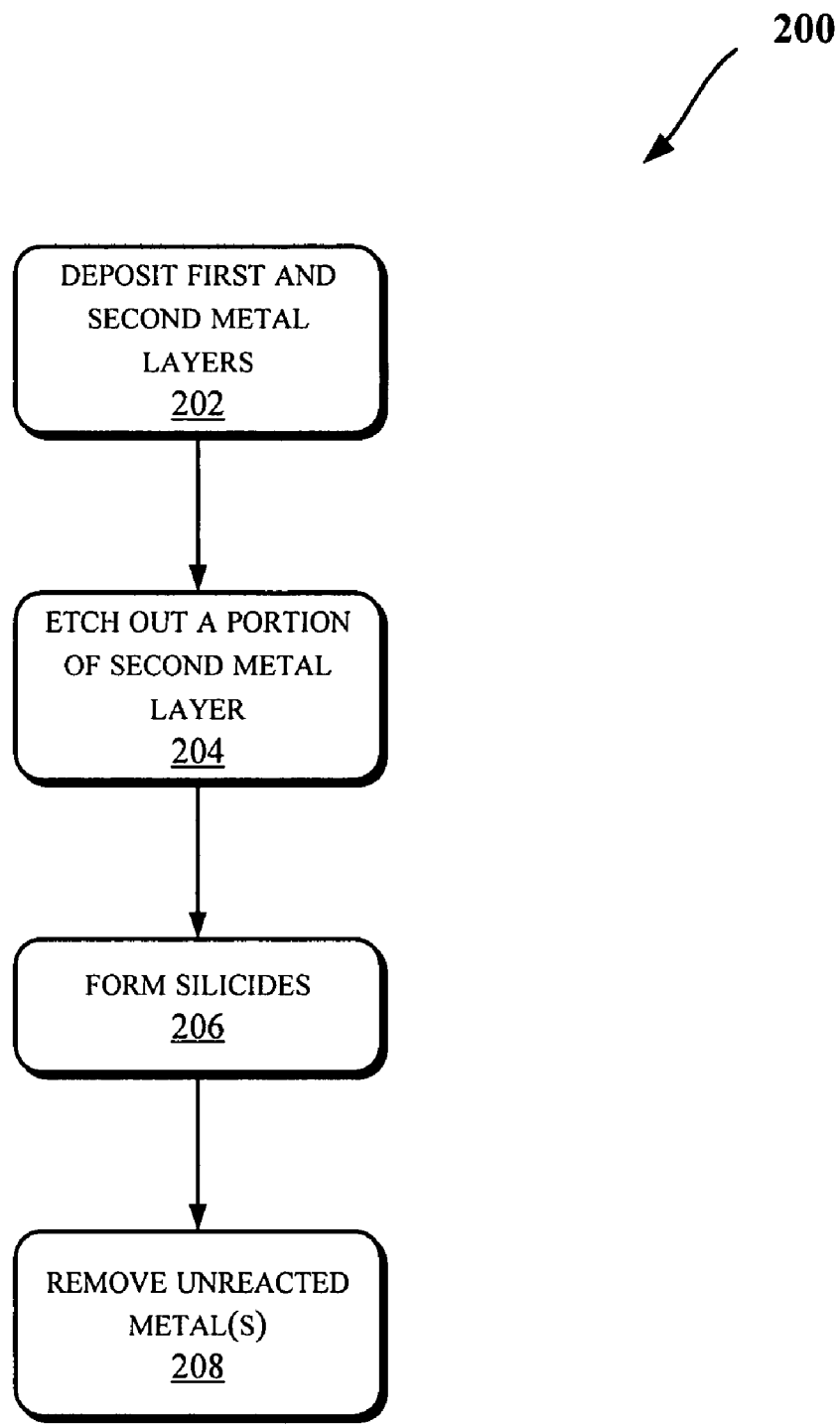
FIGS. 2 and 4 illustrate block diagrams of methods to provide silicides on a single semiconductor wafer, in accordance with some embodiments.

Referring to FIGS. 1A-2, at an operation 202 (e.g., see FIG. 1A), a first metal layer (e.g., layer 102) and a second metal layer (e.g., layer 104) may be deposited on a wafer (e.g., wafer structures 106). The wafer structures 106 may be used to form source, drain, or gate of a transistor in an embodiment. In one embodiment, layers 102 and 104 may be deposited at operation 202 with select thickness (e.g., metal 102 may be thinner than metal 104 to facilitate interdiffusion in an embodiment).

At an operation 204 (e.g., see FIG. 1B), a portion of the second metal layer (e.g., layer 104) may be etched out, e.g., via a photoresist mask. In an embodiment, the etching of operation 204 may be performed over parts of the wafer where silicide of the first metal layer is to be formed. At an operation 206 (e.g., see FIG. 1C), silicides may be formed (e.g., silicides 110 and 112 may be formed). For example, bi-metal silicide 110 may be a silicide of an alloy of the first metal layer 102 and the second metal layer 104. In an embodiment, operation 206 may be performed by annealing the wafer (e.g., by annealing the structure shown in FIG. 1B) after photoresist removal. At an operation 208 (e.g., see FIG. 1D), unreacted metal layer(s) may be removed, e.g., via wet etch. In one embodiment, at operation 208, the remaining metal layers 102 and/or 104 may be removed to provide the structure shown in FIG. 1D which includes two different silicides 110 and 112.

FIGS. 3A-3G illustrate various resulting semiconductor structures in accordance with some embodiments discussed herein. FIG. 4 illustrates a flow diagram of a method 400 to provide silicides on a single semiconductor wafer, in accordance with an embodiment. In accordance with one embodiment, the method 400 (and resulting structures of FIGS. 3A-3G) may be used to form a single metal silicide over some parts of a wafer and alloy silicides over other parts of the wafer. In an embodiment, alloying may occur by interdiffusion of one metal into existing silicide of another metal such as discussed with reference to FIGS. 3A-4.

Figure 3A:
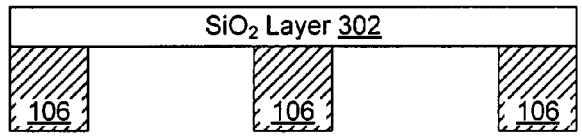
Figure 3B:
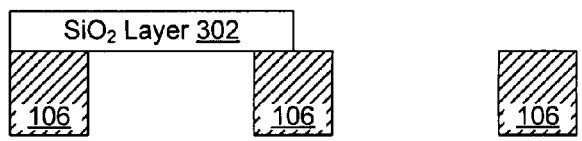
Figure 3C:
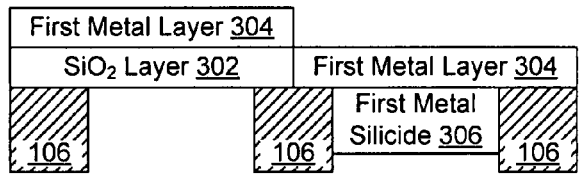
Figure 3D:
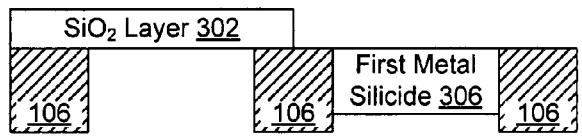
Figure 3E:
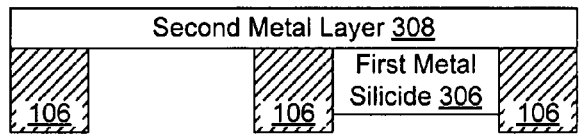
Figure 3F:
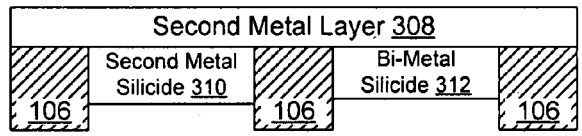
Figure 3G:
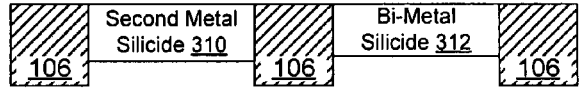
Figure 4:
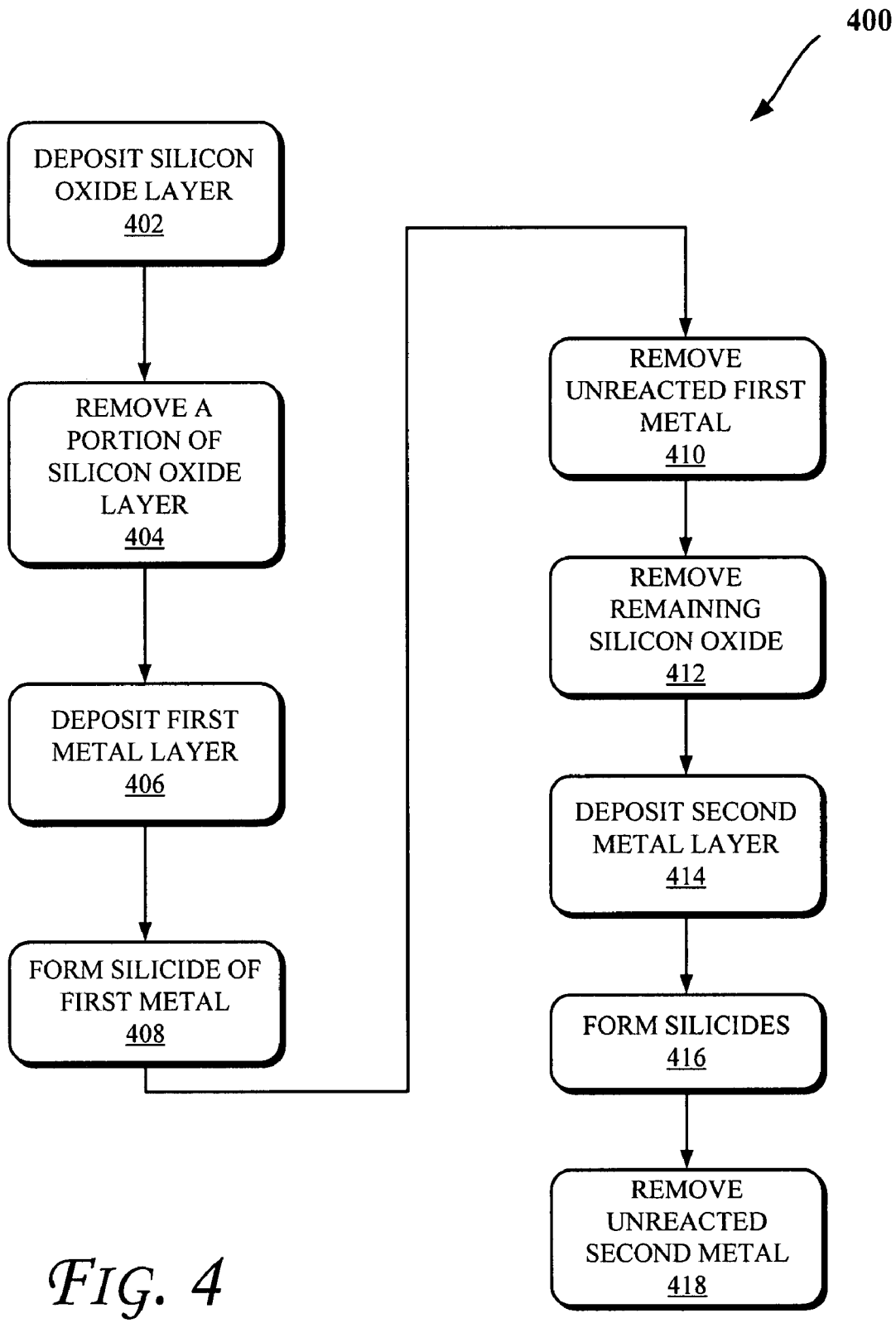

Referring to FIGS. 3A-4, at an operation 402 (e.g., see FIG. 3A), a silicon oxide layer (e.g., layer 302) may be deposited over a wafer (e.g., over the wafer structures 106), e.g., to form a hard mask. In an embodiment, the wafer structures 106 may be used to form source, drain, or gate of a transistor. At an operation 404 (e.g., see FIG. 3B), a portion the deposited silicon oxide layer may be removed, e.g., over parts of the wafer where alloy silicide is to be formed. At an operation 406 (e.g., see FIG. 3C), a first metal layer (e.g., metal layer 304) may be deposited over the wafer. At an operation 408 (e.g., see FIG. 3D), a first metal layer silicide (e.g., silicide 306)

may be formed over an exposed portion of the wafer (e.g., where $SiO_2$ was removed at operation 404), e.g., by annealing in an embodiment.

At an operation 410 (e.g., see FIG. 3D), the unreacted portion of the first metal layer (e.g., layer 304) may be removed, e.g., via wet etch. At operation 412 (e.g., see FIG. 3E), remaining silicon oxide may be removed. At an operation 414 (e.g., see FIG. 3E), the second metal layer (e.g., layer 308) may be deposited over the wafer. At an operation 416 (e.g., see FIG. 3F), a second metal silicide (e.g., silicide 310, which may be a silicide of the second metal layer 308) and a bi-metal silicide 312 (e.g., a silicide of an alloy of the first metal layer 304 and the second metal layer 308) may be formed, e.g., via annealing. At an operation 418 (e.g., see FIG. 3G), the unreacted second metal layer (e.g., layer 308) may be removed, e.g., via wet etch. In an embodiment, after operation 418, the structure shown in FIG. 3G with two different silicides may be provided.

In accordance with some embodiments, silicides of Pt and Ni which have relatively higher barrier heights may be used in conjunction with silicides that have relatively lower barrier heights such as Ta, Ti and Er. Other silicides such as silicides of Ni, Yb, Y, W, Co, or alloys thereof may be used in some embodiments. In addition, alloy silicides may have different work functions depending upon the metal constituents. For example, doping NiSi with Pt or Al may increase the barrier height while doping NiSi with Ti may lower the barrier height in some embodiments. To this end, some of the embodiments discussed herein may be used for a process that integrates single metal silicides with alloy silicides on a single semiconductor silicon wafer. Accordingly, in one embodiment, independent improvement of interface resistance of a Negative Metal-Oxide Semiconductor Field-Effect Transistor (NMOSFET) and a Positive Metal-Oxide Semiconductor Field-Effect Transistor (PMOSFET) on a single wafer may be achieved.

Reference in the specification to "one embodiment" or "an embodiment" means that a particular feature, structure, and/or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A semiconductor device comprising:
  a semiconductor wafer;
  a first silicide coupled between a first portion and a second portion of the wafer; and
  a second silicide coupled between the second portion and a third portion of the wafer, wherein the first silicide comprises a silicide of a first metal layer and wherein the second silicide comprises a silicide of an alloy of the first metal layer and a second metal layer and wherein:
    the first silicide is to be formed in response to annealing a first exposed portion of wafer corresponding to where a portion of a deposited silicon oxide layer is removed; and
    the second silicide is to be formed in response to annealing a second exposed portion of the wafer, corresponding to where a remaining portion of the silicon oxide layer is removed.

2. The device of claim 1, wherein the first silicide and the second silicide have different barrier heights.

3. The device of claim 1, wherein one or both of the first and second silicides are formed via metal interdiffusion.

4. The device of claim 3, wherein the metal interdiffusion is to occur with or without a presence of a hard mask.

5. The device of claim 4, wherein the hard mask comprises a silicon oxide layer.

6. The device of claim 1, wherein one or both of the first silicide and the second silicide comprise a silicide of: Ta, Ti, Er, Pt, Al, Ni, Yb, Y, W, Co, or alloys thereof.

7. The device of claim 1, further comprising a third silicide of the second metal layer that is to be formed in response to annealing the first exposed portion of the wafer.

8. The device of claim 7, wherein the third silicide is to be interdiffused with the second metal layer to form the second silicide.

9. A method comprising:
  forming a first silicide of a first metal layer on a wafer;
  forming a second silicide of an alloy of the first metal layer and a second metal layer on the wafer; and
  depositing a silicon oxide layer over the wafer, wherein:
    the first silicide is to be formed in response to annealing a first exposed portion of wafer corresponding to where a portion of the silicon oxide layer is removed; and
    the second silicide is to be formed in response to annealing a second exposed portion of the wafer, corresponding to where a remaining portion of the silicon oxide layer is removed.

10. The method of claim 9, wherein forming the first silicide and the second silicide comprises:
  depositing the first metal layer on the wafer;
  depositing the second metal layer on the wafer; and
  etching a portion of the second metal layer.

11. The method of claim 9, further comprising depositing the first metal layer on the wafer after depositing the silicon oxide layer and prior to annealing the first exposed portion of the wafer.

12. The method of claim 11, further comprising
  depositing the second metal layer after the remaining portion of the silicon oxide layer is removed and prior to annealing the second exposed portion of the wafer.

13. The method of claim 9, further comprising removing one or more portions of one or more metal layers.

14. The method of claim 9, wherein annealing the first exposed portion of the wafer is to form a third silicide of the second metal layer.

15. The method of claim 14, further comprising interdiffusing the third silicide with the second metal layer to form the second silicide.

16. The method of claim 14, further comprising interdiffusing the third silicide with the second metal layer to form the second silicide with or without a presence of a hard mask.

* * * * *